United States Patent
Ryan et al.

(10) Patent No.: US 8,728,931 B2
(45) Date of Patent: May 20, 2014

(54) MULTI-LAYER BARRIER LAYER FOR INTERCONNECT STRUCTURE

(75) Inventors: Vivian W. Ryan, Berne, NY (US);
Xunyuan Zhang, Albany, NY (US);
Paul R. Besser, Sunnyvale, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/553,977

(22) Filed: Jul. 20, 2012

(65) Prior Publication Data

US 2014/0021613 A1 Jan. 23, 2014

(51) Int. Cl.
*H01L 21/4763* (2006.01)
(52) U.S. Cl.
USPC .................. 438/625; 257/751; 257/E21.597; 257/E23.011; 257/E21.585; 257/E21.589
(58) Field of Classification Search
USPC .......... 438/625, 624, 627, 617, 637, 653, 453
See application file for complete search history.

(56) References Cited

U.S. PATENT DOCUMENTS

| | | | |
|---|---|---|---|
| 6,207,558 B1* | 3/2001 | Singhvi et al. | 438/648 |
| 6,534,865 B1* | 3/2003 | Lopatin et al. | 257/751 |
| 8,319,208 B2 | 11/2012 | Sorenson et al. | |
| 2003/0085470 A1 | 5/2003 | Hasunuma | |
| 2005/0054191 A1* | 3/2005 | Yu et al. | 438/629 |
| 2005/0272254 A1 | 12/2005 | Ding et al. | |
| 2006/0071350 A1 | 4/2006 | Fan et al. | |
| 2010/0085801 A1* | 4/2010 | Sorenson et al. | 365/151 |
| 2010/0200991 A1* | 8/2010 | Akolkar et al. | 257/751 |
| 2011/0017499 A1 | 1/2011 | Yang et al. | |
| 2012/0001330 A1* | 1/2012 | Huisinga et al. | 257/751 |
| 2012/0077053 A1 | 3/2012 | Akolkar et al. | |

OTHER PUBLICATIONS

Office Action from related U.S. Appl. No. 13/657,182 dated Jun. 11, 2013.
Office Action from related U.S. Appl. No. 13/554,020 dated Jan. 30, 2013.
Final Office Action from related U.S. Appl. No. 13/554,020 dated Aug. 14, 2013.
Office Action from related U.S. Appl. No. 13/770,026 dated Oct. 10, 2013.

* cited by examiner

*Primary Examiner* — Chuong A Luu
*Assistant Examiner* — Rudolfo Fortich
(74) *Attorney, Agent, or Firm* — Amerson Law Firm, PLLC (57) ABSTRACT

A method for forming an interconnect structure includes forming a recess in a dielectric layer of a substrate. An adhesion barrier layer is formed to line the recess. A first stress level is present across a first interface between the adhesion barrier layer and the dielectric layer. A stress-reducing barrier layer is formed over the adhesion barrier layer. The stress-reducing barrier layer reduces the first stress level to provide a second stress level, less than the first stress level, across a second interface between the adhesion barrier layer, the stress-reducing barrier layer, and the dielectric layer. The recess is filled with a fill layer.

21 Claims, 7 Drawing Sheets

MULTI-LAYER BARRIER LAYER FOR INTERCONNECT STRUCTURE

CROSS-REFERENCE TO RELATED APPLICATIONS

Not applicable.

STATEMENT REGARDING FEDERALLY SPONSORED RESEARCH OR DEVELOPMENT

Not applicable

BACKGROUND

The disclosed subject matter relates generally to the field of semiconductor device manufacturing, and more particularly, to a multi-layer barrier layer for an interconnect structure.

A conventional integrated circuit device, such as a microprocessor, is typically comprised of many thousands of semiconductor devices, e.g., transistors, formed above the surface of a semi-conductive substrate. For the integrated circuit device to function, the transistors must be electrically connected to one another through conductive interconnect structures. The back end of line (BEOL) is the second portion of integrated circuit fabrication where the individual devices (transistors, capacitors, resistors, etc.) get interconnected with wiring on device. BEOL generally begins when the first layer of metal is deposited on the wafer. It includes contacts, insulating layers (dielectrics), metal levels, and bonding sites for chip-to-package connections. Many modern integrated circuit devices are very densely packed, i.e., there is very little space between the transistors formed above the substrate. Thus, these conductive interconnect structures must be made in multiple layers to conserve plot space on the semiconductor substrate.

The conductive interconnect structures are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

A contact is generally used to define an interconnect structure (e.g., using polysilicon or metal) to an underlying polysilicon layer (e.g., source/drain or gate region of a transistor), while a via denotes a metal to metal interconnect structure. In either case, a contact opening is formed in an insulating layer overlaying the conductive member. A second conductive layer is then formed over the contact opening and electrical communication is established with the conductive member.

One technique for reducing the size of the features formed on the semiconductor device involves the use of copper for the lines and interconnections in conjunction with new dielectric materials having lower dielectric constants than previously achievable with common dielectric material choices. Standard dielectric materials such as silicon dioxide, TEOS, and F-TEOS have dielectric constants greater than 3. The new dielectric materials, commonly referred to as low-k dielectrics, have dielectric constants less than 3, and thus, allow greater device densities, due to their more efficient isolation capabilities. One such low-k dielectric is sold under the name of Black Diamond, by Applied Materials, Inc.

Typical interconnect features include a metal stack including three materials, a barrier layer, a seed layer, and bulk fill. The barrier layer serves to inhibit migration or diffusion of copper into the dielectric and also to inhibit oxygen diffusion from the dielectric into the interconnect feature. The seed layer provides favorable surface to nucleate isolets for copper grain growth, improves wettability of copper over the topography to minimize agglomeration, protects the barrier material from attack in the copper plating bath, and provides a dopant material for diffusion into the copper to mitigate electromigration (EM) and stress migration (SM).

In a narrow BEOL pitch, the barrier and seed layers must be relatively thin to accommodate the geometry while leaving enough room for the bulk copper fill. Due to continuous scaling to smaller dimensions, it becomes more difficult to create barrier and seed layers that are capable of performing their functions.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for forming an interconnect structure. The method includes forming a recess in a dielectric layer of a substrate. An adhesion barrier layer is formed to line the recess. A first stress level is present across a first interface between the adhesion barrier layer and the dielectric layer. A stress-reducing barrier layer is formed over the adhesion barrier layer. The stress-reducing barrier layer reduces the first stress level to provide a second stress level, less than the first stress level, across a second interface between the adhesion barrier layer, the stress-reducing barrier layer, and the dielectric layer. The recess is filled with a fill layer.

Another aspect of the disclosed subject matter is seen in a semiconductor device including a recess defined in a dielectric layer and an interconnect structure defined in the recess. The interconnect structure includes an adhesion barrier layer lining the recess, a stress-reducing barrier layer over the adhesion barrier layer, and a fill material substantially filling the recess. The stress-reducing barrier layer reduces a first stress level in the adhesion barrier layer to provide a second stress level, less than the first stress level, across an interface between the adhesion barrier layer, the stress-reducing barrier layer, and the dielectric layer.

BRIEF DESCRIPTION OF THE SEVERAL VIEWS OF THE DRAWINGS

The disclosed subject matter will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
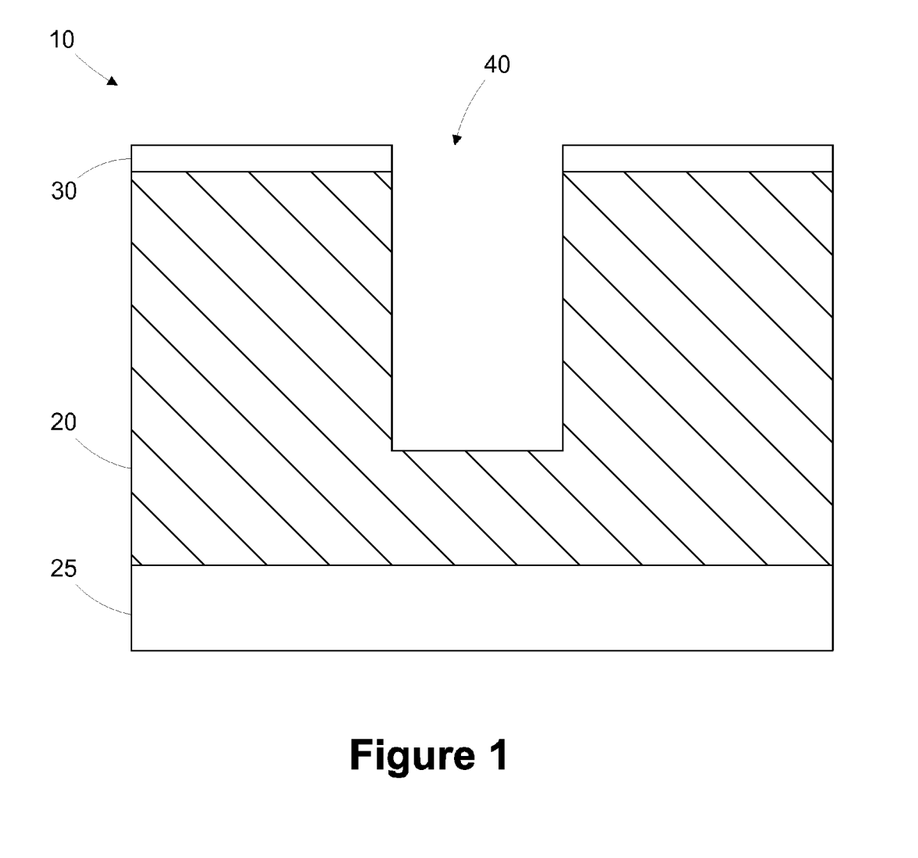
FIG. 1 is a cross section view of a partially completed interconnect structure.

Referring now to the drawings wherein like reference numbers correspond to similar components throughout the several views and, specifically, referring to FIGS. 1, the disclosed subject matter shall be described in the context of a method for fabricating an interconnect structure. FIG. 1 is a cross-section view of a partially completed interconnect structure 10. A dielectric layer 20 has been provided on a substrate 25. The dielectric layer may represent an interlayer dielectric layer disposed between a device layer or metallization layer and another metallization layer. In one embodiment, the dielectric layer 20 may have a low dielectric coefficient, commonly referred to as a low-k dielectric. One such suitable low-k dielectric material is Black Diamond, offered by Applied Materials, Inc. A hard mask layer 30 is formed to provide a template for etching a recess 40. In the illustrated embodiment, the recess 40 is a trench in which an interconnect line feature is being formed, however, the methods described herein may also be applied to other types of interconnects, such as via structures or dual damascene trench and via structures, where an underlying metal region is being contacted by the interconnect feature. Hence, the recess 40 may be a trench, a via opening, or a combined trench and via opening.

Figure 2:
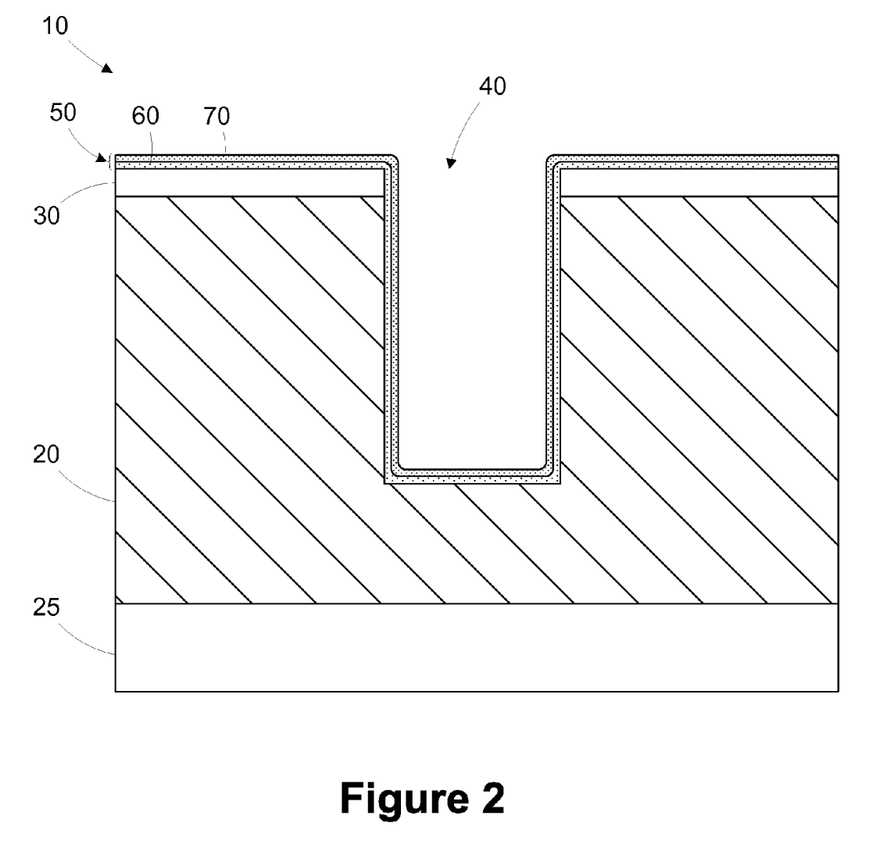
FIG. 2 is a cross-section view of the structure of FIG. 1 illustrating the formation of a barrier layer.

As illustrated in FIG. 2, a barrier layer stack 50 is formed to line the recess 40. The barrier layer stack 50 includes an adhesion barrier layer 60 and a stress-reducing barrier layer 70. The adhesion barrier layer 60 provides good adhesion between the dielectric layer 20 and the metal interconnect structure 10. Exemplary adhesion barrier materials include tantalum (Ta) or tantalum nitride (TaN), which may be formed by physical vapor deposition (PVD) or atomic layer deposition (ALD) processes known in the art. An exemplary material for the stress-reducing barrier layer 70 includes an alloy of tantalum and a transition metal (TaMx), which may be formed using a PVD process. Exemplary transition metals could include any element in the d-block of the periodic table, which includes groups 3 to 12 on the periodic table. In the illustrated embodiment, titanium (Ti) is used to form the alloy with tantalum (Ta) in the stress-reducing barrier layer 70. The use of a TaMx alloy reduces the overall resistance of the barrier layer stack 50, and also reduces the likelihood of pipe diffusion for copper.

The TaMx alloy in the stress-reducing barrier layer 70 reduces stress in the interconnect structure 10 by reducing the delta stress. Delta stress is the absolute value of stress in the metal film stack (Cu fill plus any barrier) minus stress in the low-k dielectric layer 20. The use of the adhesion barrier layer 60 provides the opportunity to modulate the delta stress. The stress-reducing barrier layer 70 is engineered to reduce the stress present in the adhesion barrier layer 60 across the interface with the dielectric layer 20, thereby also reducing the net delta stress. Hence, stress level present across the interface between the adhesion barrier layer 60 and the dielectric layer 20 is changed by the stress-reducing barrier layer 70 to provide a reduced stress level across the interface between the adhesion barrier layer 60, the stress-reducing barrier layer 70, and the dielectric layer 20. The stress may be tensile or compressive, depending on the particular application, geometry, and materials. The stress reduction reduces stress between the layers 60, 70 and also the stress at critical interfaces of the interconnect structure 10, such as the interfaces at corner regions. Thus, the stress-reducing barrier layer 70 serves to reduce the stress differential across the interconnect/dielectric interface. The percentages of tantalum and transition metal, Mx, in the stress-reducing barrier layer 70 may be about 60-93% and 7-40%, respectively.

Figure 3:
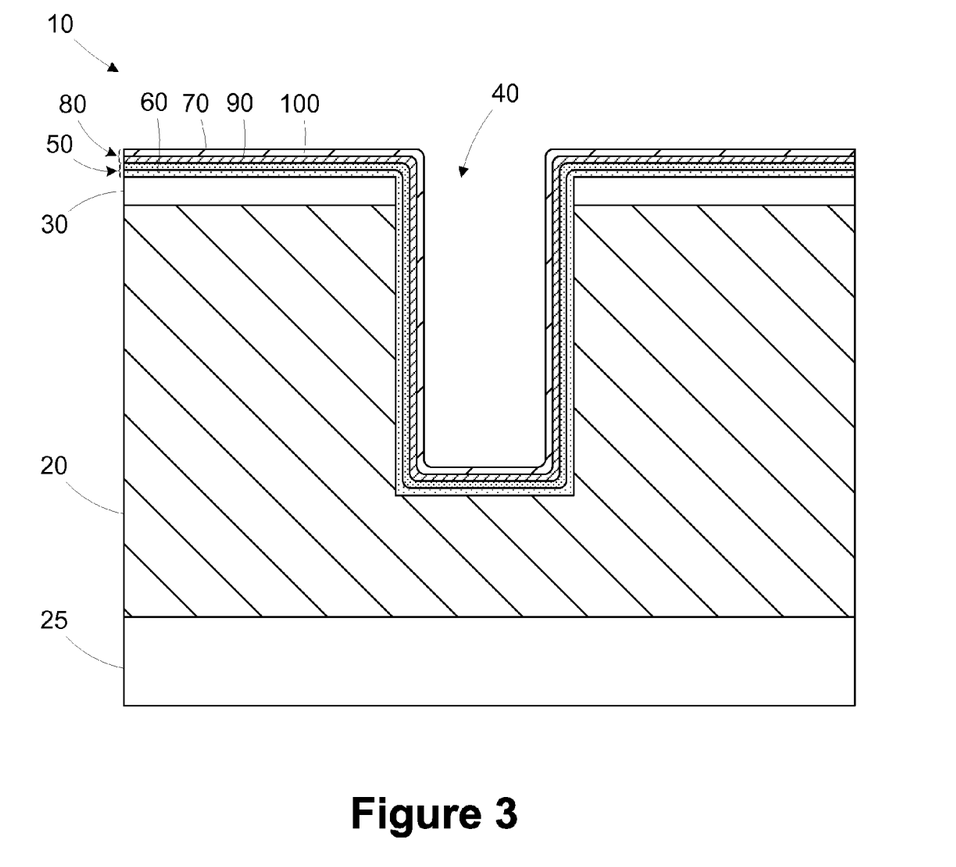
FIG. 3 is a cross-section view of the structure of FIG. 2 illustrating the formation of a transition metal layer at corners of the interconnect structure.

As illustrated in FIG. 3, a seed layer stack 80 is formed over the barrier layer stack 50 to line the recess 40. The seed layer stack 80 includes an undoped seed layer 90 and a doped seed layer 100. In the illustrated embodiment, the seed layer 90 is undoped copper, and the doped seed layer 100 may be a copper alloy such as copper-manganese (CuMn). Other alloy metals for the doped seed layer 100 include aluminum, gold, calcium, zinc, cadmium, silver, tin, etc.

Figure 4:
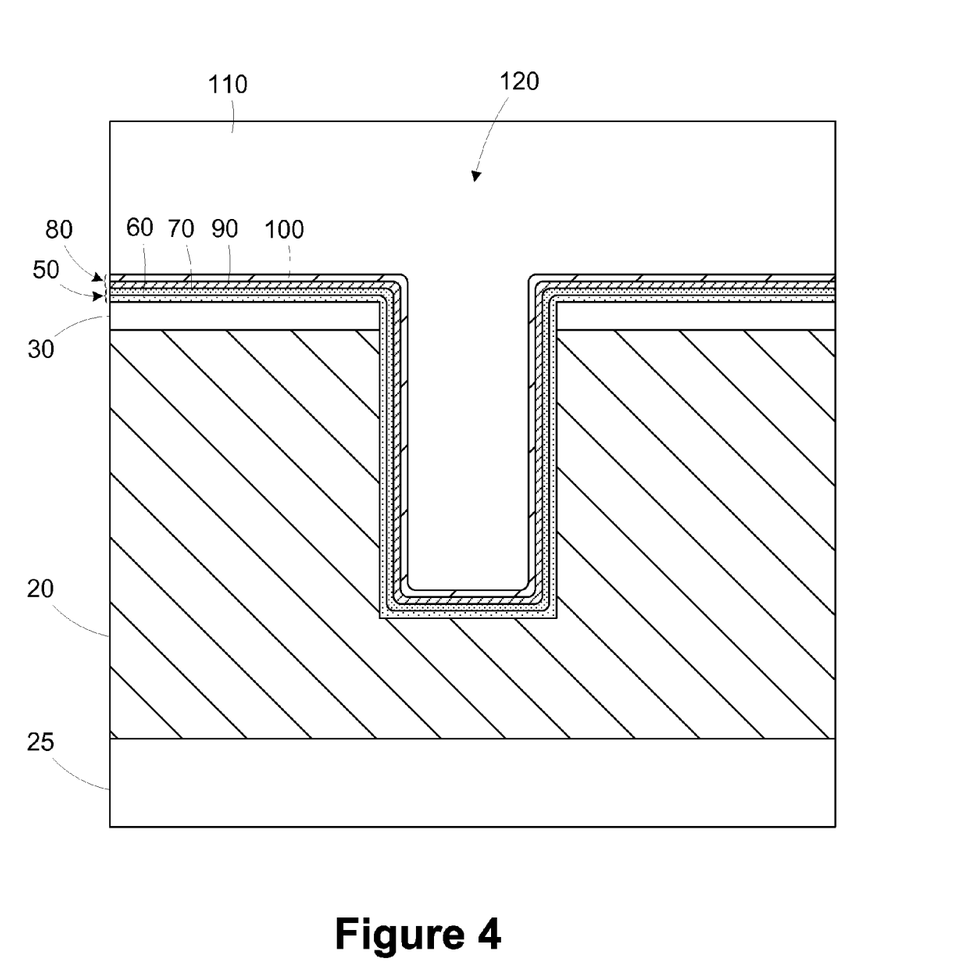
FIG. 4 is a cross-section view of the structure of FIG. 3 illustrating the formation of a ruthenium layer.

In FIG. 4, a bulk copper fill is performed using an electroplating process or a PVD copper process with reflow to form copper fill layer 110. After the fill process, an anneal process is performed to realign the grain boundaries and increase the grain size of the copper layer 110. During the anneal process, the dopant in the doped seed layer 100 diffuses into the copper fill layer 110 to improve its EM and SM resistance. The dopant tends to migrate to the upper surface 120 of the copper fill layer 110. Some dopant may also diffuse into the undoped seed layer 90, however, the undoped seed layer 90 acts as a buffer to limit dopant diffusion into dislocations present in the barrier layer stack 50. An exemplary anneal process may be conducted at 100-400° C. for 30-60 min.

Figure 5:
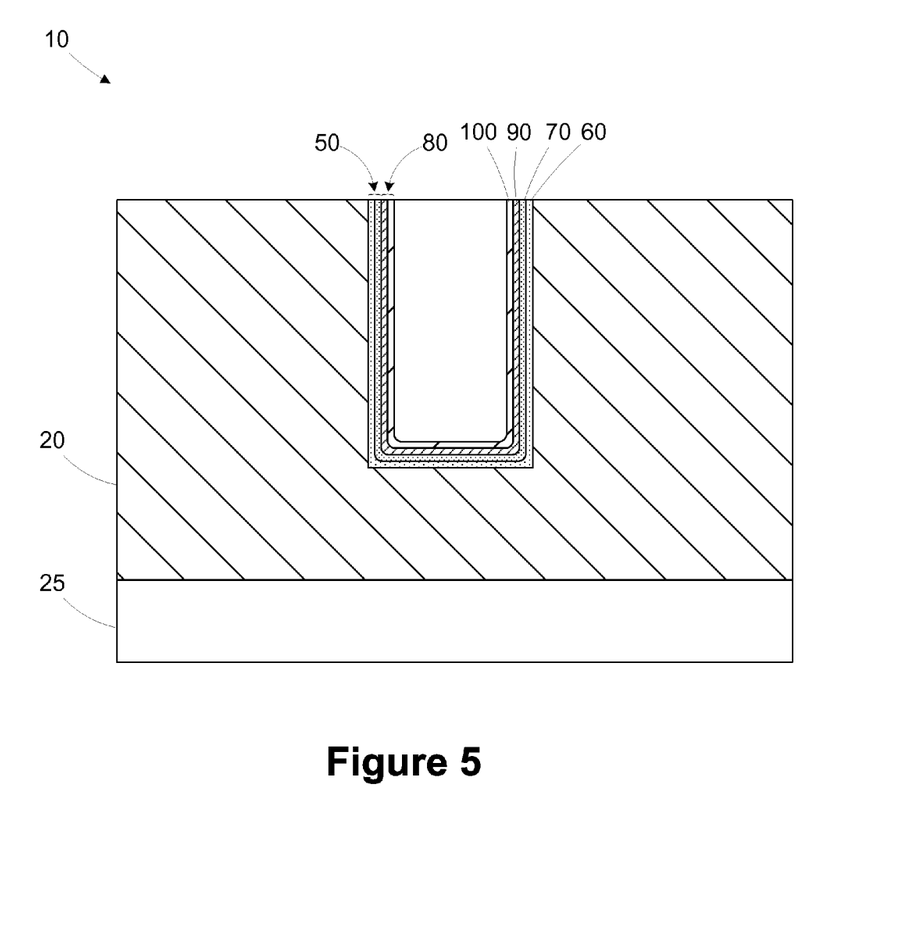
FIG. 5 is a cross-section view of the structure of FIG. 4 illustrating a copper fill process.

Subsequently, a chemical mechanical polishing (CMP) process is performed to remove excess copper fill material 110. During the polishing process the horizontal portions of the seed layer stack 80, the barrier layer stack 50, and the hard mask layer 30 are removed, resulting in the structure shown in FIG. 5.

Figure 6:
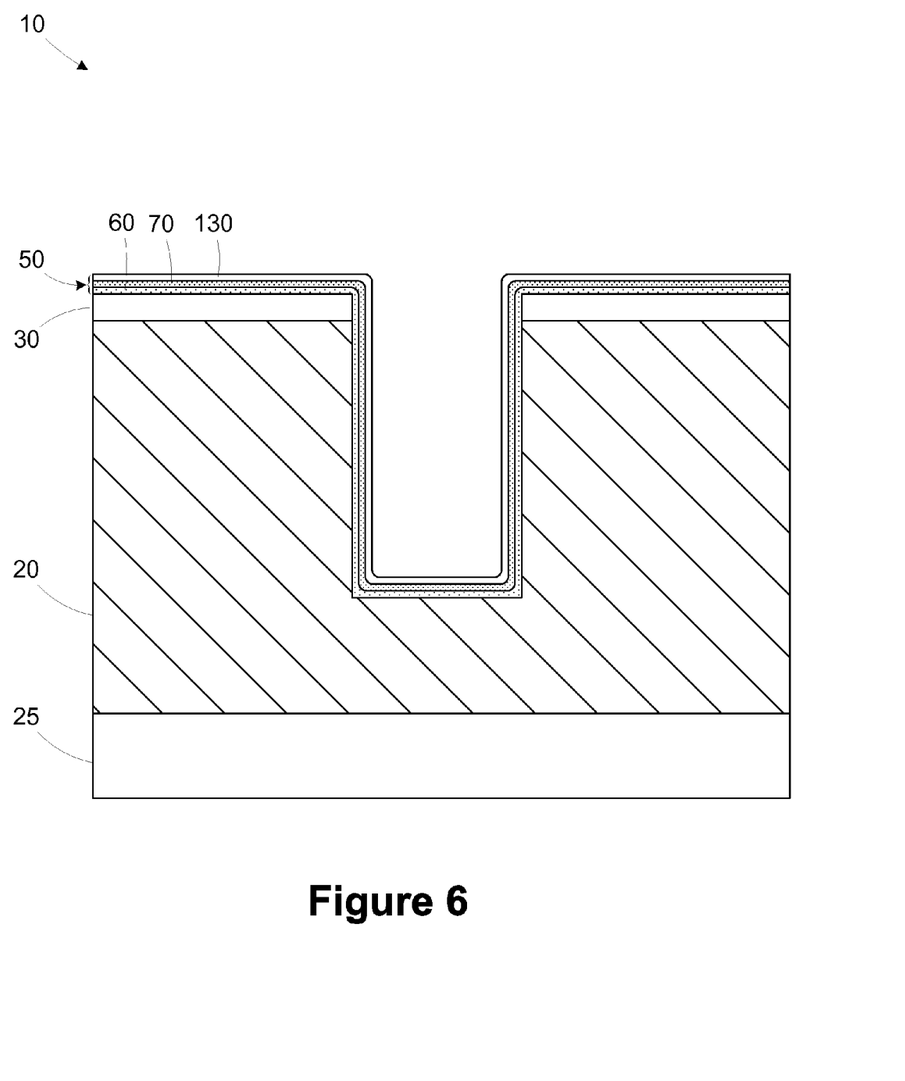
FIG. 6 is a cross-section view of the structure of FIG. 5 illustrating a copper anneal process to form alloy regions at the corners.

Referring to FIG. 6, an embodiment is illustrated where the barrier layer stack 50 also includes a wetting layer 130. In the illustrated embodiment, the material of the wetting layer 130 is ruthenium (Ru), but other transition metals having relatively high wettabilities for copper that may be used are osmium, rhodium, palladium, platinum, iridium, niobium, and cobalt. The wetting layer 130 acts as a seed enhancement layer to improve the copper seed coverage, thereby enhancing the copper fill. The wetting layer 130 allows direct copper plating of the seed layer stack 80.

Figure 7:
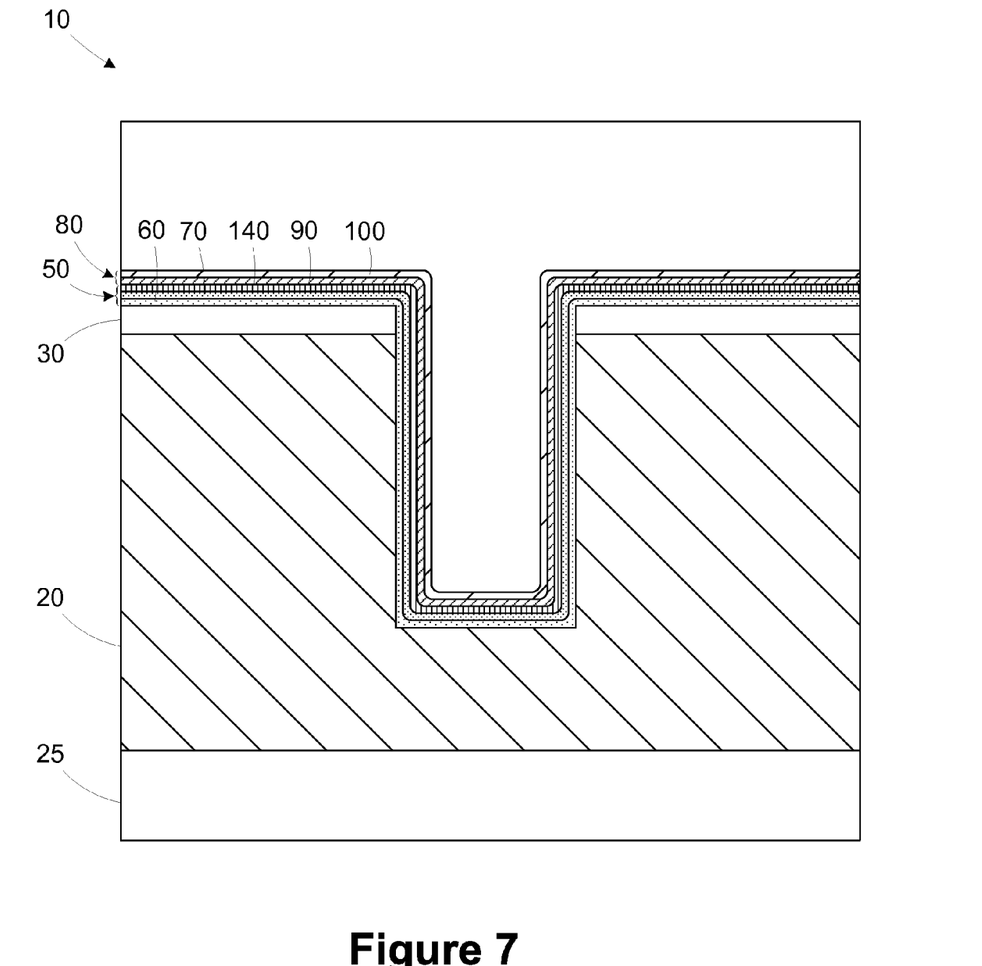
FIG. 7 is a cross-section view of the structure of FIG. 6 illustrating a polishing process to remove excess copper and recess the copper at the corners.

As illustrated in FIG. 7, during the anneal process performed after the copper fill layer 110 has been formed, transition metal from the stress-reducing barrier layer 70 diffuses into the wetting layer 130, creating an alloy layer 140 (e.g., RuTi). The alloy serves to change the characteristics of the wetting layer 130 to improve its efficacy as a barrier layer for mitigating EM and SM. This change increases the overall effectiveness of the barrier layer stack 50, while also providing an advantage during the copper fill process.

The use of the multiple layer barrier layer stack 50 and the seed layer stack 80 as described herein provides process advantages and reliability advantages (i.e., EM and SM resistance). The stress gradient across the interconnect/dielectric interface is reduced in both the barrier layer stack 50 and the seed layer stack 80.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
forming a dielectric layer above a substrate;
performing an etch process on the dielectric layer to form a recess therein;
forming an adhesion barrier layer on and in direct contact with exposed surfaces of the dielectric layer so as to line the recess, wherein a first stress level is present across a first layer interface that is defined where the adhesion barrier layer directly contacts the dielectric layer;
forming a stress-reducing barrier layer over the adhesion barrier layer, wherein the stress-reducing barrier layer reduces the first stress level across the first layer interface to a second stress level that is less than the first stress level; and
filling the recess with at least one layer of conductive material.

2. The method of claim 1, wherein the stress-reducing barrier layer comprises an alloy of tantalum and a transition metal other than tantalum.

3. The method of claim 2, wherein the transition metal comprises titanium.

4. The method of claim 1, wherein filling the recess comprises forming a wetting layer above the stress-reducing barrier layer.

5. The method of claim 4, wherein the wetting layer comprises ruthenium.

6. The method of claim 4, wherein the stress-reducing barrier layer comprises an alloy of tantalum and a transition metal other than tantalum, and the method further comprises performing an annealing process so as to diffuse the transition metal into the wetting layer and thereby form an alloy layer.

7. The method of claim 6, wherein the wetting layer comprises ruthenium and the transition metal comprises titanium.

8. The method of claim 1, wherein the at least one layer of conductive material comprises copper.

9. The method of claim 1, further comprising:
forming a first seed layer over the stress-reducing barrier layer;
forming a doped seed layer over the first seed layer, wherein the doped seed layer comprises a dopant not present in the first seed layer.

10. The method of claim 9, wherein the dopant comprises manganese.

11. The method of claim 1, wherein the adhesion barrier layer comprises tantalum.

12. The method of claim 1, wherein the recess comprises a trench.

13. The method of claim 1, wherein the recess comprises a via opening.

14. A method, comprising:
forming a dielectric layer above a substrate;
performing an etch process on the dielectric layer to form a recess therein, wherein the dielectric layer is exposed at least at sidewall surfaces of the recess;
forming an adhesion barrier layer on and in direct contact with the exposed dielectric layer along at least the sidewall surfaces of the recess;
forming a second barrier layer over the adhesion barrier layer, the second barrier layer comprising an alloy of tantalum and a transition metal other than tantalum;
forming a wetting layer above the second barrier layer;
filling the recess with at least one layer of conductive material; and
performing an annealing process so as to diffuse the transition metal into the wetting layer and thereby form an alloy layer.

15. The method of claim 14, wherein the transition metal comprises titanium.

16. The method of claim 14, wherein the wetting layer comprises ruthenium.

17. The method of claim 14, wherein the at least one layer of conductive material comprises copper.

18. The method of claim 14, wherein forming the adhesion barrier layer comprises creating a first stress level across a first layer interface that is defined where the adhesion barrier layer directly contacts the dielectric layer, and wherein forming the second barrier layer comprises reducing the first stress level at the first layer interface to a second stress level less than the first stress level.

19. The method of claim 18, wherein forming the second barrier layer comprises creating a third stress level across a second layer interface that is defined where the second barrier layer directly contacts the adhesion barrier layer, the third stress level being less than the second stress level.

20. The method of claim 1, wherein forming the stress-reducing barrier layer comprises creating a third stress level across a second layer interface that is defined where the stress-reducing barrier layer directly contacts the adhesion barrier layer, the third stress level being less than the second stress level.

21. The method of claim 1, wherein the dielectric layer is an interlayer dielectric layer that is disposed between a device layer and a metallization layer or between two metallization layers.

* * * * *

UNITED STATES PATENT AND TRADEMARK OFFICE
CERTIFICATE OF CORRECTION

| | |
|---|---|
| PATENT NO. | : 8,728,931 B2 |
| APPLICATION NO. | : 13/553977 |
| DATED | : May 20, 2014 |
| INVENTOR(S) | : Ryan et al. |

It is certified that error appears in the above-identified patent and that said Letters Patent is hereby corrected as shown below:

On the Title Page, in the Assignee item [73], delete "GLOBALFOUNDRIES, Inc." and insert therefor -- GLOBALFOUNDRIES Inc. --.

Signed and Sealed this
Twenty-ninth Day of July, 2014

Michelle K. Lee
*Deputy Director of the United States Patent and Trademark Office*